(12) United States Patent
Takaishi (10) Patent No.: US 6,184,145 B1
(45) Date of Patent: Feb. 6, 2001

(54) METHOD OF MANUFACTURING SEMI-CONDUCTOR MEMORY DEVICE USING TWO ETCHING PATTERNS

(75) Inventor: Yoshihiro Takaishi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/306,802

(22) Filed: May 7, 1999

(30) Foreign Application Priority Data

May 25, 1998 (JP) .................................................. 10-143540

(51) Int. Cl.[7] .................................................. H01L 21/302
(52) U.S. Cl. ............................................ 438/706; 438/719
(58) Field of Search .................................... 438/587, 588, 438/592, 593, 595, 283, 719, 720, 726, 706

(56) References Cited

U.S. PATENT DOCUMENTS

| | | | |
|---|---|---|---|
| 4,053,349 | * 10/1977 | Simko | 438/531 |
| 5,541,133 | * 7/1996 | Peek | 438/587 |
| 5,595,924 | * 1/1997 | Yuan et al. | 438/587 |
| 5,811,329 | * 9/1998 | Ahmad et al. | 438/233 |
| 5,923,977 | * 7/1999 | Ahmad et al. | 438/587 |

FOREIGN PATENT DOCUMENTS 7-105442   11/1995   (JP) .

* cited by examiner

Primary Examiner—Benjamin Utech
Assistant Examiner—Duy-Vu Deo
(74) Attorney, Agent, or Firm—Sughrue, Mion, Zinn, Macpeak & Seas, PLLC (57) ABSTRACT

In a method of manufacturing a semiconductor device, a laminate film is formed on an insulating film which is formed on a semiconductor substrate. The laminate film is composed of a conductive layer and an insulating layer formed on the conductive layer. A first etching process is carried out to the laminate film using a first mask to form a first group of patterns for first gates and a second group of patterns. Then, a polysilicon layer for pad polysilicon films is deposited after the first etching process. Subsequently, a second etching process is carried out to the patterns of the second group using a second mask to form a third group of patterns for second gates.

10 Claims, 11 Drawing Sheets

METHOD OF MANUFACTURING SEMICONDUCTOR MEMORY DEVICE USING TWO ETCHING PATTERNS

BACKGROUND OF THE INVENTION

1. Field of the Invention

The present invention relates to a method of manufacturing a semiconductor device, and more particularly to a method of manufacturing a semiconductor device in which gate electrodes are formed through two etching processes.

2. Description of the Related Art

In conjunction with the fine pattern formation and high integration of a semiconductor integrated circuit, a wiring pattern size and a contact size are reduced in the semiconductor integrated circuit such as a DRAM. Also, the margin between the contact and the wiring pattern is reduced. As a result, a short-circuit becomes easily formed between the contact and a word line. Thus, it has become difficult to form a memory cell. To solve this problem, a method is known in which a pad polysilicon is used in the memory cell.

FIGS. 1A to 1G are cross sectional views of a conventional semiconductor memory device formed by a conventional manufacturing method.

Figure 1A:
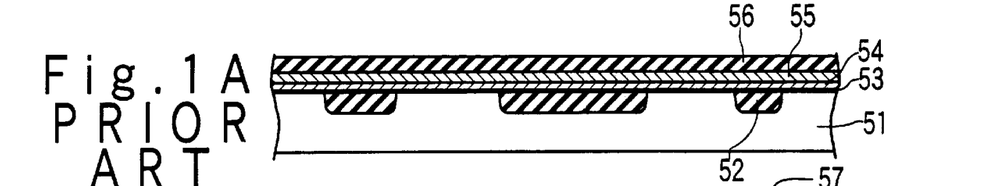
FIGS. 1A to 1G are cross sectional views of a conventional semiconductor memory device in a conventional manufacturing method.

As shown in FIG. 1A, element separation films 52 are selectively formed in the surface of a semiconductor substrate 51 to segment an element formation region. Subsequently, an oxide layer 53 is formed for a gate oxide film on the semiconductor substrate. Subsequently, a polysilicon layer 54 is formed for a gate lower electrode on the gate oxide film 53 to have the film thickness of 100 nm. Then, a WSi layer 55 is formed for a gate upper electrode on the polysilicon layer 54 to have the film thickness of 150 nm. Thus, the gate lower electrode and the gate upper electrode are formed for a word line and the gate electrode. After that, a mask oxide layer 56 is formed on the WSi layer 55 to have the film thickness of about 200 nm.

Figure 1B:
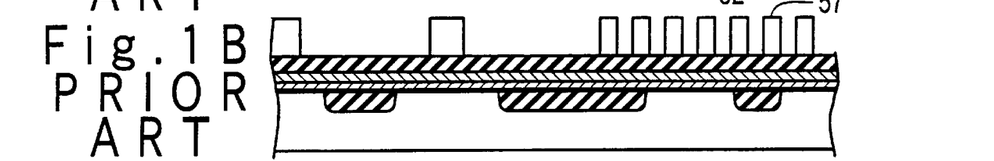

Next, as shown in FIG. 1B, a resist film 57 for the gate electrode is formed on the mask oxide layer 56. Using the resist film 57 as a mask, the mask oxide layer 56, the WSi layer 55, and the polysilicon layer 54 are etched or patterned in order to form gate electrode structures. Then, N-type diffusion layers 58 are formed in the silicon substrate through opening portions between the gate electrode structures by an ion implantation process.

Figure 1C:
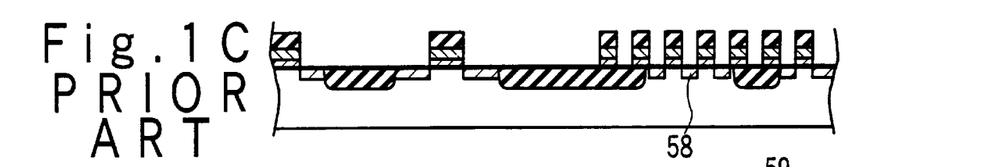

Next, as shown in FIG. 1C, an oxide layer is deposited on the whole surface of the silicon substrate 51. The oxide layer is etched backed and removed to form side wall oxide films 59 for each of the gate electrode structure such that only a portion of the diffusion layers where a pad polysilicon region is to be formed is opened.

Figure 2:
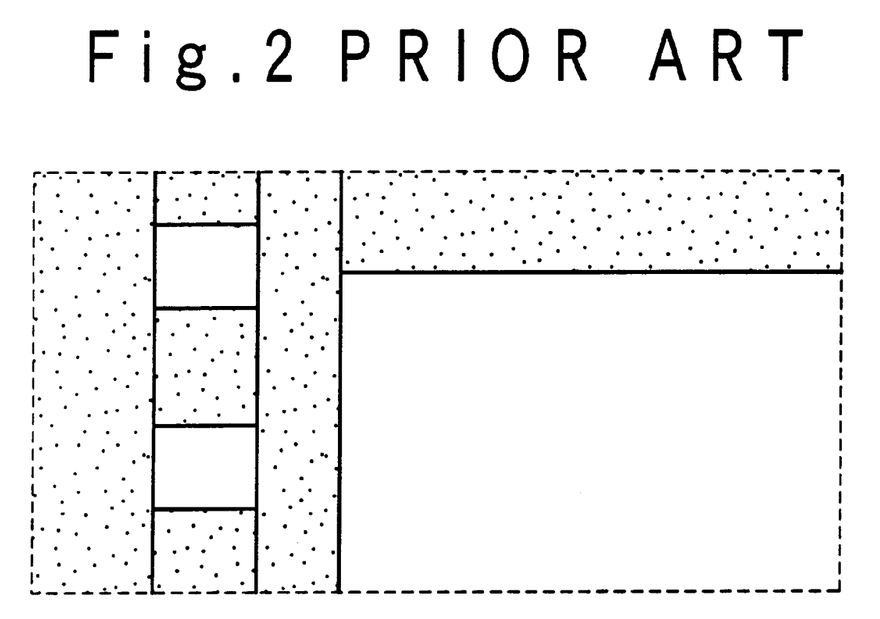
FIG. 2 is a plan view of a mask used in the conventional manufacturing method of FIGS. 1A to 1G.
Figure 3:
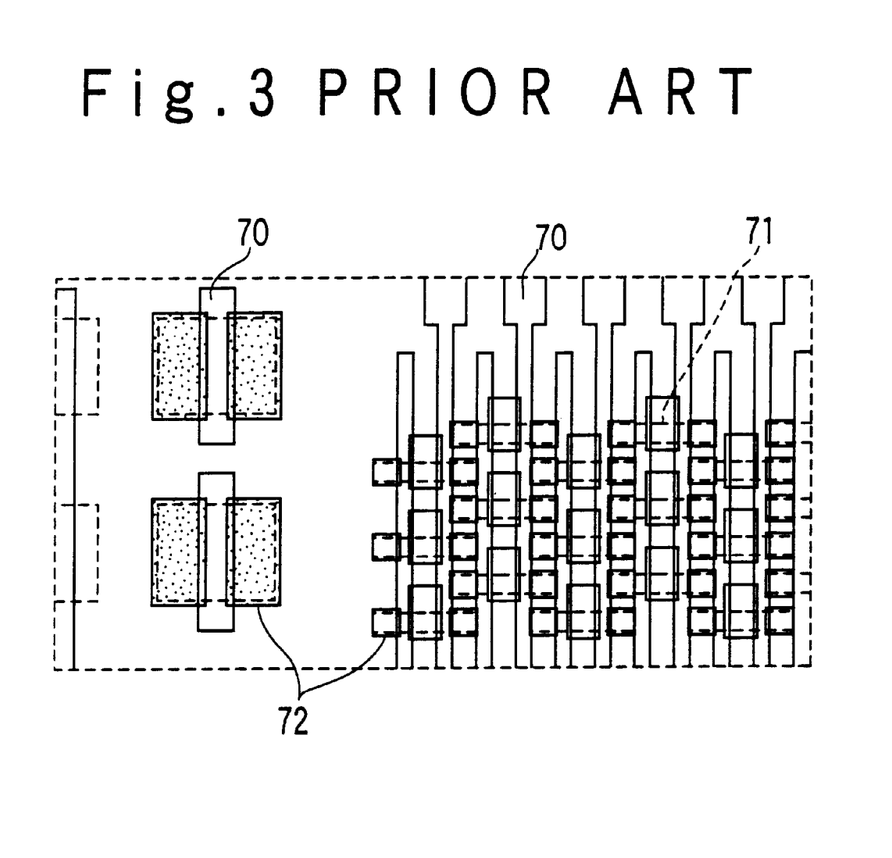
FIG. 3 is another mask used in the conventional manufacturing method of FIGS. 1A to 1G.

FIG. 2 shows a mask pattern which is used in this case. Also, FIG. 3 is a plan view of a wiring layout pattern in the conventional semiconductor memory device. The element separation insulating films, the gate electrode structures and pad polysilicon patterns are shown in FIG. 3. The oxide layer is etched back using the resist mask shown in FIG. 2. In this way, the oxide layer in a peripheral circuit section and the oxide layer on the diffusion layer where pad polysilicon films are formed can be removed.

Figures 1D, 1E:
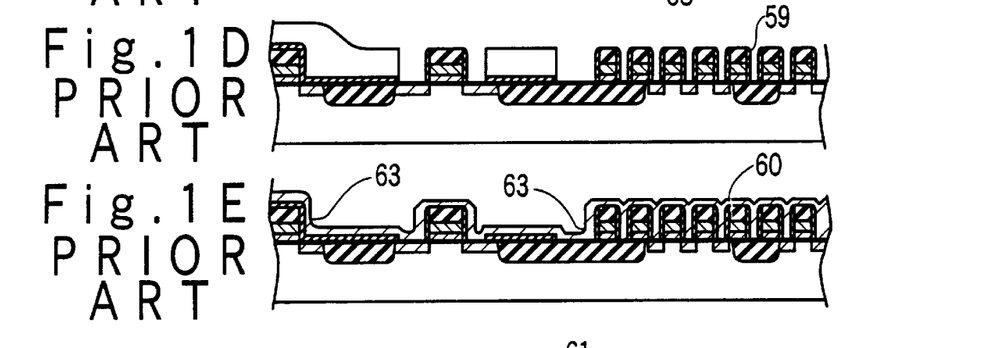
Figure 1F:
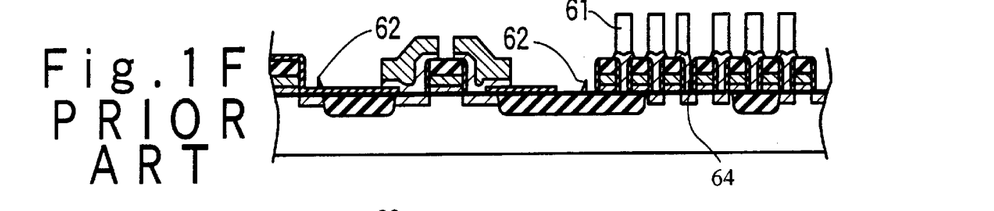
Figure 1G:
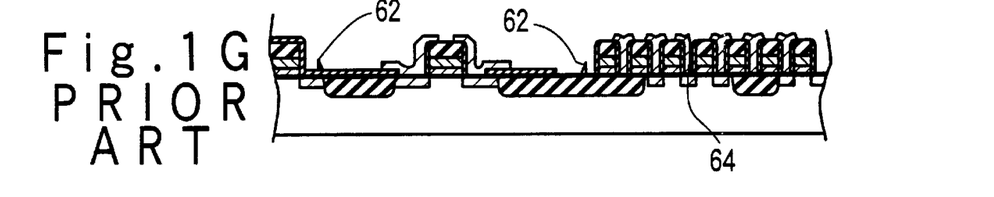

Next, as shown in FIG. 1E, a polysilicon layer 60 is deposited on the whole surface of the substrate 51. Then, as shown in FIG. 1F, a resist pattern 61 for the polysilicon layer 60 is formed and the polysilicon layer 60 is etched for the pad polysilicon films. Subsequently, as shown in FIG. 1G, the resist pattern 61 is removed so that pad polysilicon films remain.

However, when the pad polysilicon films are formed by the above-mentioned conventional method, there is a part where the gate interval between the gate electrodes is wide. For this reason, a steep step 63 exists in the polysilicon layer. When there is the steep step, a part of the polysilicon layer is left near the side wall at the time of the etching process of the polysilicon layer 60 for the formation of the pad polysilicon films. The left part 62 functions a mask in the subsequent processes.

Also, in a photolithography process for the pad polysilicon films, the silicon substrate is possibly damaged at the time of the etching process of the polysilicon film because of variance of photoresist patterns in size and displacement between the diffusion layers and a mask for the pad polysilicon films. As an effective method for preventing the damage 64 of the substrate 51, there is known a method of etching the polysilicon layer using as a mask, side wall oxide films larger than the photoresist pattern in size. However, in this method, the oxide film is left at the steep step section of the polysilicon layer. Thus, there is the problem that a portion of the polysilicon layer is not etched and is left.

In conjunction with the above conventional technique, a method of forming a contact in a semiconductor integrated circuit is disclosed in Japanese Examined Patent Application (JP-B-Heisei 7-105442). In this reference, a contact pad is formed in a contact hole between word lines. An oxide film of SOG, BPSG, TEOS, and PECVD oxide is formed on an element separation oxide film to minimize a step.

SUMMARY OF THE INVENTION

An object of the present invention is to provide a method of manufacturing a semiconductor device such as a memory device with a thin and uniform pad polysilicon films.

Another object of the present invention is to provide a method of manufacturing a semiconductor device with simple and stable process.

In order to achieve an aspect of the present invention, a method of manufacturing a semiconductor device, includes:

forming a laminate film on an insulating film which is formed on a semiconductor substrate, the laminate film including a conductive layer and an insulating layer formed on the conductive layer;

performing a first etching process to the laminate film using a first mask to form a first group of patterns for first gates and a second group of patterns;

depositing a polysilicon layer for pad polysilicon films after the first etching process; and performing a second etching process to the patterns of the second group using a second mask to form a third group of patterns for second gates.

The polysilicon layer is preferably deposited such that the polysilicon layer substantially fills a space between adjacent two of the patterns of the first and second groups.

The method may further includes forming side wall insulating films on side walls of each of the patterns of the first and second groups before the depositing.

Also, the method may further includes patterning the polysilicon layer to form the pad polysilicon films. In this case, a mask insulating film may be deposited on the polysilicon layer, the mask insulating film may be patterned, and then the polysilicon layer may be patterned using the patterned mask insulating film as a mask to form the pad polysilicon films. Instead, a mask insulating film may be deposited on the polysilicon layer, the mask insulating film may be patterned, side wall insulating films may be formed on side walls of the patterned mask insulating film, and then the polysilicon layer may be patterned using the patterned mask insulating film with the side wall insulating films as a mask to form the pad polysilicon films.

The semiconductor device may be a semiconductor memory device composed of a memory cell section and a peripheral circuit section, and the first gates are of transistors for the memory cell section, and the second gates are of transistors for the peripheral circuit section.

In order to achieve another aspect of the present invention, a method of manufacturing a semiconductor device, includes:

forming a laminate film on an insulating film which is formed on a semiconductor substrate, the laminate film including a conductive layer and an insulating layer formed on the conductive layer;

performing a first etching process to the laminate film using a first mask to form a first group of patterns for first gates and a second group of patterns;

depositing a polysilicon layer for pad polysilicon films after the first etching process;

forming an oxide mask on the polysilicon layer; and patterning the polysilicon layer using the oxide mask as a mask; and performing a second etching process to the patterns of the second group using a second mask to form a third group of patterns for second gates.

In order to achieve still another aspect of the present invention, a method of manufacturing a semiconductor device, includes:

forming a laminate film on an insulating film which is formed on a semiconductor substrate, the laminate film including a conductive layer and an insulating layer formed on the conductive layer;

performing a first etching process to the laminate film to form first patterns such that a space between adjacent two of the first patterns can be filled with a polysilicon layer to be deposited; and performing a second etching process to specific ones of the first patterns to form second patterns.

DESCRIPTION OF THE PREFERRED EMBODIMENTS

Next, a method of a semiconductor device of the present invention will be described below in detail with reference to the attached drawings.

FIGS. 4A to 4I are cross sectional views of the semiconductor device such as a memory device in the manufacturing method according to the first embodiment of the present invention. FIG. 5 is a plan view of the semiconductor device.

Figure 4A:
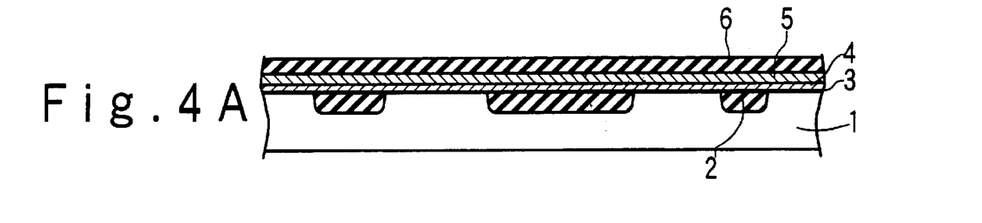
FIGS. 4A to 4I are cross sectional views of a semiconductor memory device in a manufacturing method according to a first embodiment of the present invention.
Figure 5:
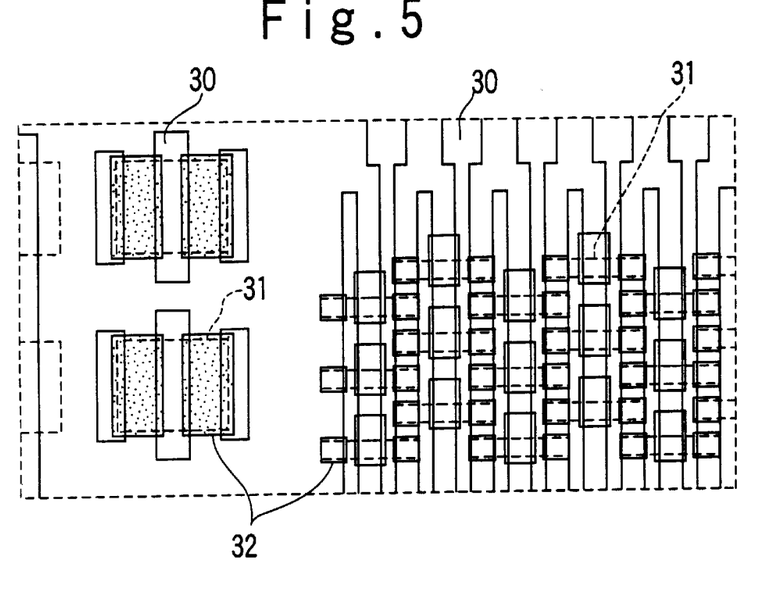
FIG. 5 is a plan view of the semiconductor device produced by the manufacturing method according to the first embodiment of the present invention.

As shown in FIG. 4A, element separation oxide films 2 are selectively formed in the surface of a semiconductor substrate 1 to segment element formation regions. Subsequently, a gate oxide layer 3 is formed on the whole surface of the substrate 1. Subsequently, a polysilicon layer 4 is formed for gate lower electrodes on the gate oxide layer 3 to have the film thickness of 100 nm. After that, a WSi layer 5 is formed for gate upper electrodes on the polysilicon layer 4 to have the film thickness of 150 nm. Both of the polysilicon layer 4 and the WSi layer 5 are used for the gate lower electrode and the gate upper electrode of a gate electrode and a word line. Then, a mask oxide layer 6 is formed on the WSi layer 5 to have the film thickness of about 200 nm.

Figure 4B:
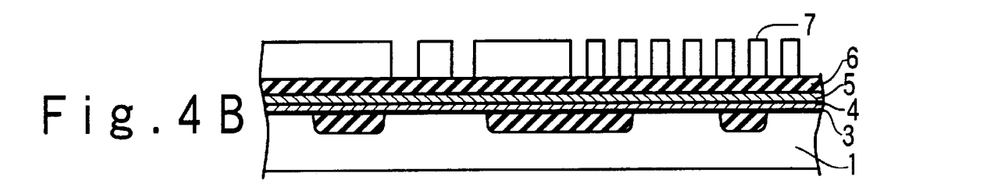
Figure 6:
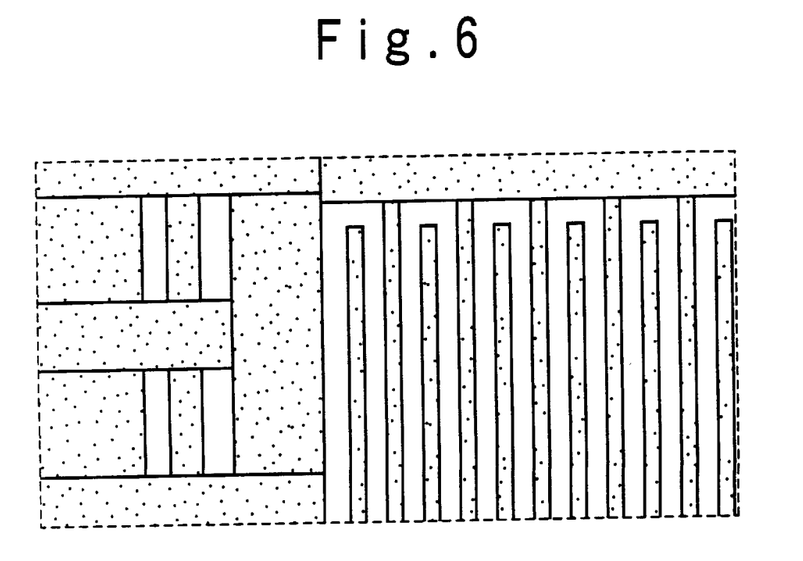
FIG. 6 is a plan view of a first photoresist mask used in the manufacturing method according to the first embodiment of the present invention.

Next, as shown in FIG. 4B, a first resist pattern 7 is formed on the mask oxide layer 6. FIG. 5 is the plan view of the semiconductor device such as a DRAM formed by the manufacturing method. In FIG. 5, element separation oxide films 31, gate electrodes 30, pad polysilicon films 32 are illustrated. Pad polysilicon films are formed on all diffusion layers in a memory cell section (the right-hand side region in FIG. 4A), and a pad polysilicon film is formed on a part of the element separation oxide film in a peripheral circuit section (the left-hand side region in FIG. 4A). FIG. 6 is a plan view of a first gate mask pattern shown in FIG. 4B. In FIG. 6, an area where a lot of points are illustrated is an area where the gate patterns are to be formed. In the first gate mask pattern, and the first resist pattern is left in a region where gate electrodes are to be formed but any pad polysilicon film is not necessary to be formed. On the other hand, the first resist pattern is left for the gate electrodes in the other region where gate electrodes are to be formed and the pad polysilicon films are necessary to be formed.

Figure 4C:
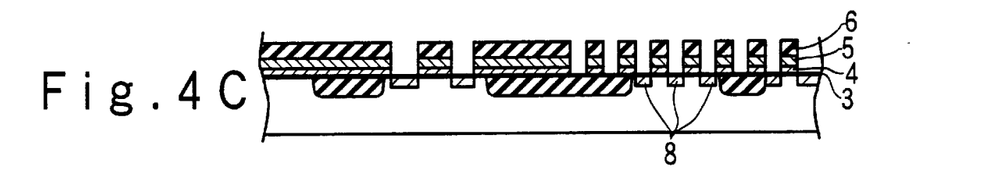

After that, as shown in FIG. 4C, the mask oxide layer 6 is etched and patterned using the first resist pattern 7 as a mask. After that, the WSi layer 5 and the polysilicon layer 4 are etched and patterned using the patterned mask oxide layer 6 as a mask to form the gate electrode structures each composed of the mask oxide film 6, the gate upper electrode 5, the gate lower electrode 4. At this time, using the first resist pattern 7 as the mask, the mask oxide layer 6, the WSi layer 5, the polysilicon layer 4 may be etched in order. In this way, opening portions between the gate electrodes are formed in the region where the pad polysilicon films are to be formed. The maximum space between the gate structures is preferably equal to or less than 0.3 μm.

Figure 4D:
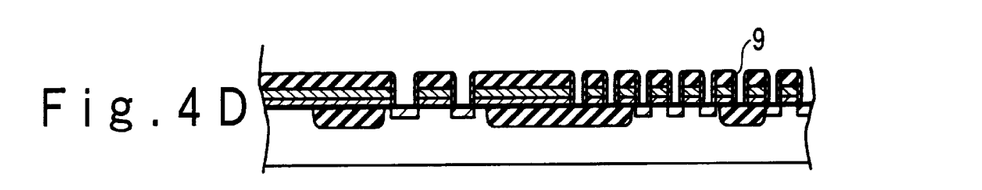
Figure 4E:
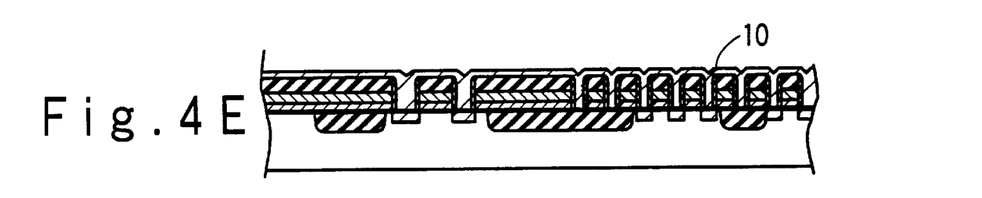

Next, N-type diffusion layers 8 are formed in the silicon substrate through the opening portions using an ion implantation process. Subsequently, as shown in FIG. 4D, an oxide layer is deposited on the whole surface of the substrate and an etching back process is carried out to form side wall oxide films 9 on side walls of the formed gate structures. After that, as shown in FIG. 4E, a polysilicon layer 10 is deposited on the whole surface of the substrate for pad polysilicon films to have the film thickness in a range of 100 to 150 nm. The polysilicon layer 10 can substantially fill the opening portions, because the maximum space between the gate structures is equal to or less than 0.3 μm as described above.

Figure 4F:
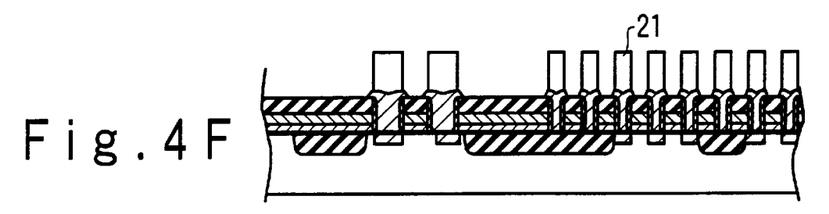

After that, as shown in FIG. 4F, a resist pattern 21 of a predetermined shape is formed on the polysilicon layer 10. Then, the polysilicon layer 10 is etched using the resist pattern 21 as a mask to form the pad polysilicon films in the memory cell section and a part of the peripheral circuit section.

Figure 4G:
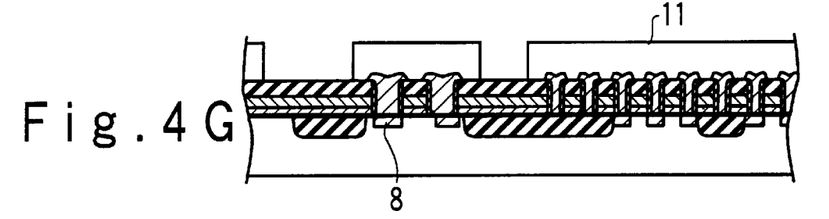
Figure 7:
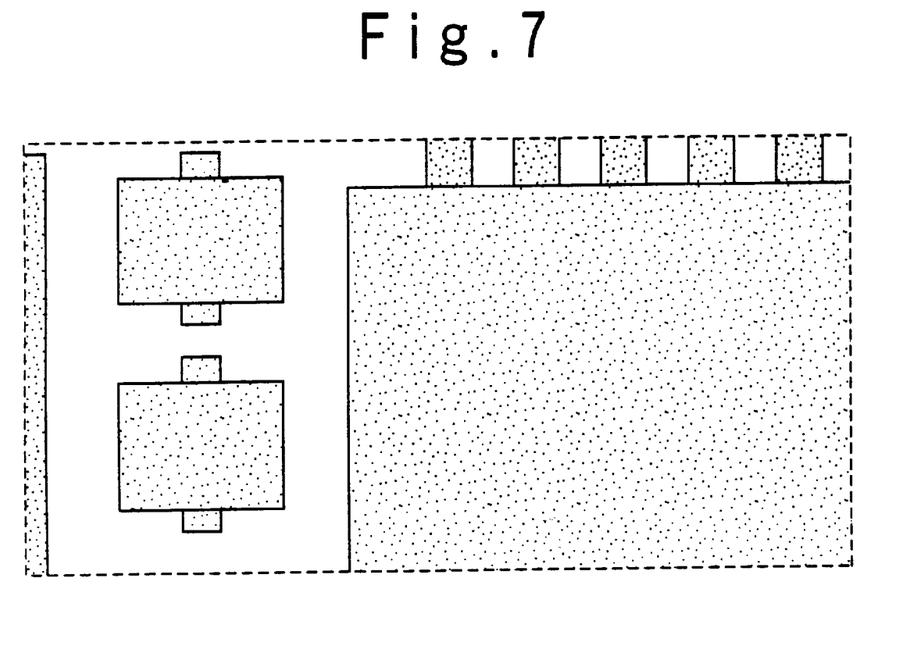
FIG. 7 is a plan view of a second photoresist mask used in the in the manufacturing method according to the first embodiment of the present invention.

Next, as shown in FIG. 4G, a second gate resist pattern 11 is formed on the substrate. FIG. 7 is a plan view of a second gate resist pattern 11. In FIG. 7, the region where a lot of points are illustrated is the region to be protected from a subsequent etching process.

Figure 4H:
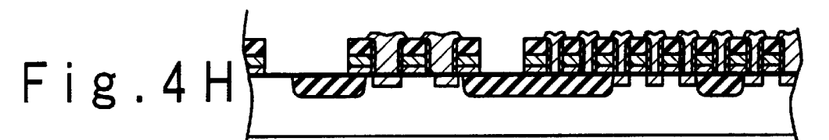

Next, as shown in FIG. 4H, a part of the gate electrode structures in the peripheral circuit section is etched using the second gate pattern 11 as a mask, so that new gate structures are formed. That is, the mask oxide film 6, the gate upper electrode 5, the gate lower electrode 4 are etched in order using the second gate pattern 11 as a mask. In this way, all the gate electrode structure and the pad polysilicon films can be formed for the semiconductor memory device.

Figure 4I:
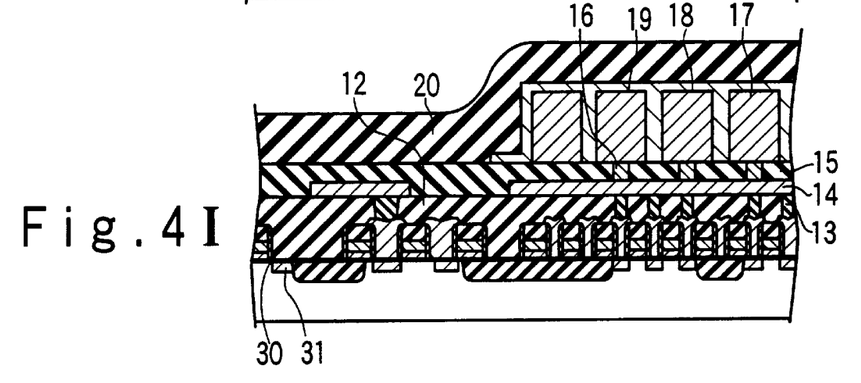

FIG. 4I shows a cross section of a memory cell of the semiconductor memory device. In addition to the structure shown in FIG. 4H, an LDD structure 30 and an N-type diffusion layer 31 are formed for a transistor in the peripheral circuit section. A first interlayer insulating film 12 is formed on the pad polysilicon films, and bit contacts 13 and a bit line 14 are formed. After a second interlayer insulating film 15 is formed, capacity contacts 16 and capacity lower electrodes 17 are formed. Capacity dielectric films 18 and capacity upper electrodes 19 are formed on the capacity lower electrode and then a third interlayer insulating film 20 is formed.

As described above, the gate photoresist process is divided into two sub-processes. Therefore, any step of the polysilicon layer is not generated when the pad polysilicon films are formed, and the photoresist process and the etching process can be simplified.

FIGS. 8A to 8J are cross sectional views of the semiconductor device in the manufacturing method according to the second embodiment of the present invention. FIG. 9 is a plan view of the semiconductor device. It should be noted that the same components as those in the first embodiment are allocated with the same reference numerals as those in the first embodiment, respectively.

Figure 8A:
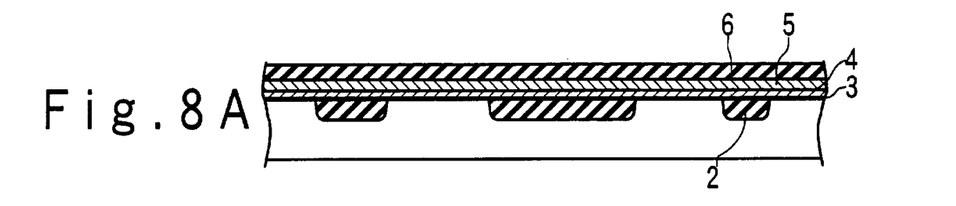
FIGS. 8A to 8J are cross sectional views of the semiconductor memory device produced in a manufacturing method according to a second embodiment of the present invention.
Figure 9:
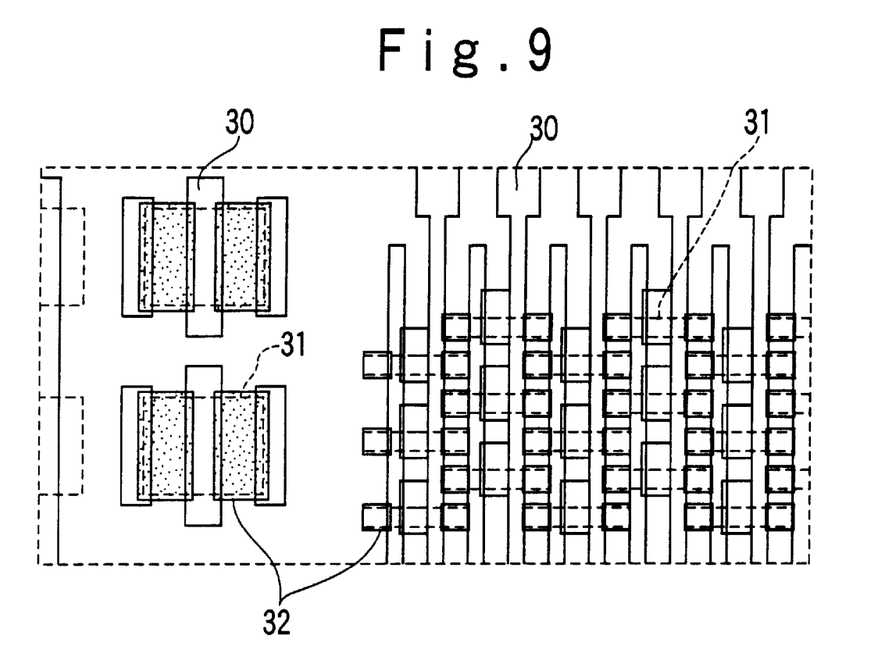
FIG. 9 is a plan view of the semiconductor memory device produced by the manufacturing method according to the second embodiment of the present invention.

As shown in FIG. 8A, the element separation films 2 are selectively formed on the surface of the semiconductor substrate 1 to segment element formation regions. Subsequently, the gate oxide layer 3 is formed on the whole surface of the substrate 1. Subsequently, the polysilicon layer 4 is formed for the gate lower electrode on the gate oxide layer 3 to have the film thickness of 100 nm. After that, a WSi layer 5 is formed for the gate upper electrode on the WSi layer 4 to have the film thickness of 150 nm. The word line is composed of both of the gate lower electrode and the gate upper electrode. Then, the mask oxide layer 6 is formed on the WSi layer 5 to have the film thickness of about 200 nm.

Figure 8B:
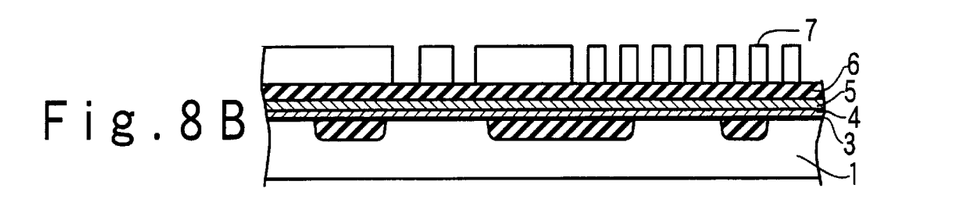
Figure 10:
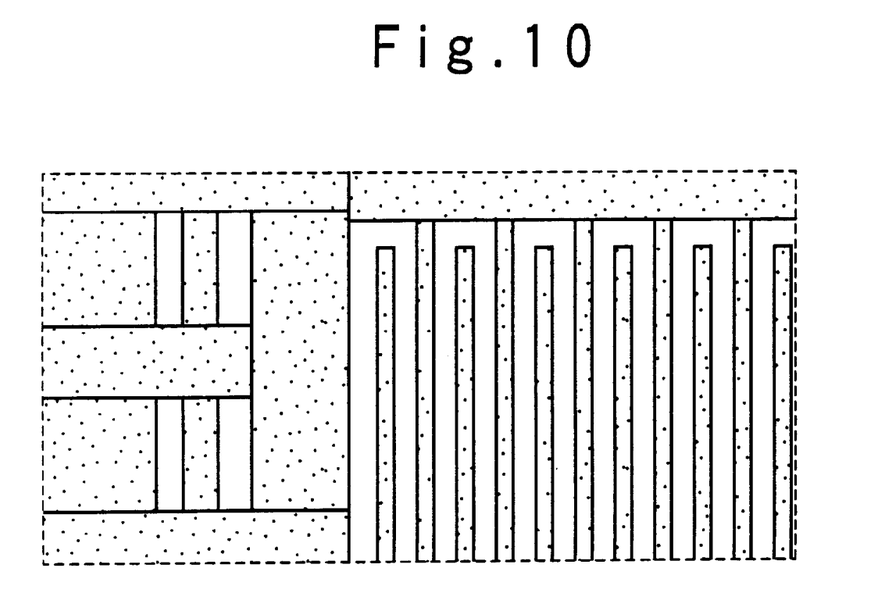
FIG. 10 is a plan view of a first gate pattern mask used in the manufacturing method according to the second embodiment of the present invention.

Next, as shown in FIG. 8B, the resist pattern 7 is formed on the mask oxide layer 6 using a first gate pattern mask. FIG. 9 is a plan view of the semiconductor device such as a DRAM formed by the manufacturing method in the second embodiment. In FIG. 9, the element separation oxide films 31, gate electrodes 30, pad polysilicon films 32 are illustrated. Pad polysilicon films are formed on all diffusion layers in a memory cell section (the right-hand side in FIG. 8A), and a pad polysilicon film is partially formed in a peripheral circuit section (the left-hand side in FIG. 8A). FIG. 10 is a plan view of a first gate pattern mask used in the process of FIG. 8B. In FIG. 10, the region where a lot of points are illustrated is an area where the gate patterns are formed. The resist pattern is removed in the region where opening portions for the pad polysilicon films are to be formed.

Figure 8C:
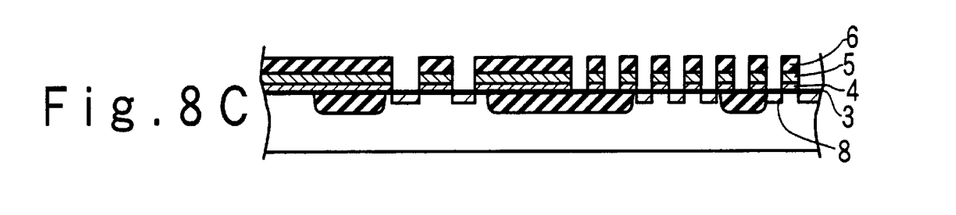

Next, as shown in FIG. 8C, the mask oxide layer 6 is etched and patterned using the first resist pattern 7 as a mask. After that, the WSi layer 5 and the polysilicon layer 4 are etched in addition to the gate oxide layer 3, using the patterned mask oxide layer 6 as a mask. In this way, the gate electrodes are formed to have the mask oxide film 6, the gate upper electrode 5 and the gate lower electrode 4. At this time, using the resist pattern 7 as the mask, the mask oxide layer 6, the WSi layer 5, the polysilicon 4 may be etched in order. In this way, the opening portions between the gate electrodes are formed in the region where the pad polysilicon films are to be formed such that the maximum distance between the gate electrodes is equal to or less than 0.3 μm. Then, N-type diffusion layers 8 are formed in the silicon substrate through the opening portions using an ion implantation process.

Figure 8D:
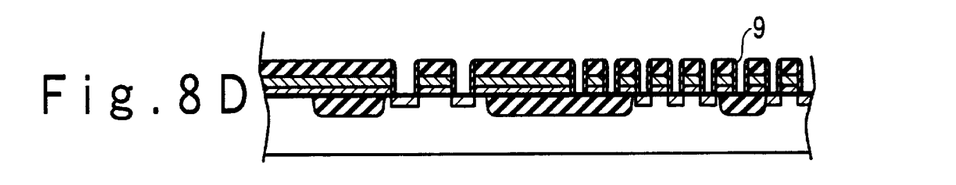
Figure 8E:
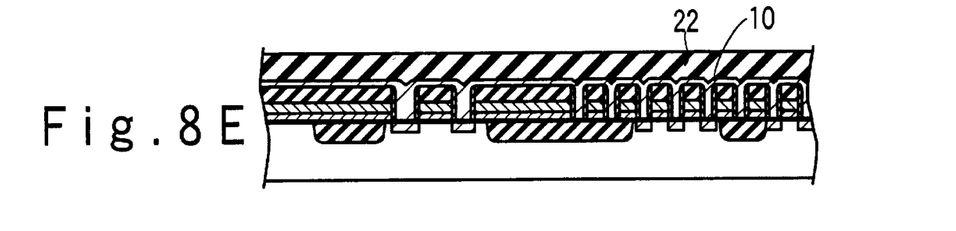

Next, as shown in FIG. 8D, an oxide layer is deposited on the whole surface of the substrate and an etching back process is carried out to form side wall oxide films 9 on side walls of each gate electrode. After that, as shown in FIG. 8E, a polysilicon layer 10 and a mask oxide layer 22 are deposited on the whole surface of the substrate in order for pad polysilicon films. The polysilicon layer 10 has the film thickness in a range of 100 to 150 nm. Therefore, the polysilicon layer 10 can substantially fill the opening portions.

Figure 8F:
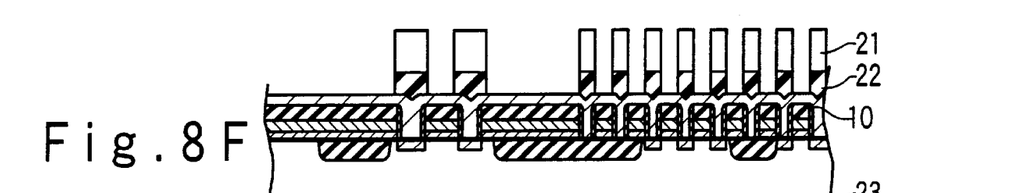
Figure 8G:
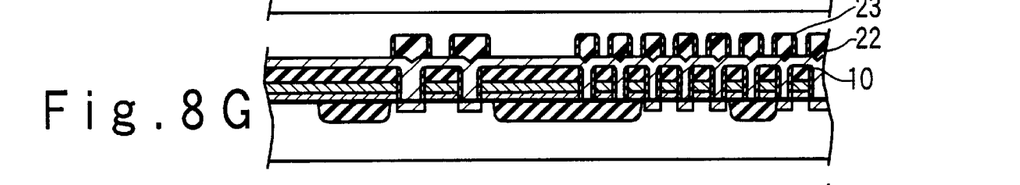

After that, as shown in FIG. 8F, a resist pattern 21 of a predetermined shape is formed on the mask oxide layer 22. Then, the mask oxide layer 22 is etched and patterned using the resist pattern 21 as a mask. Subsequently, as shown in FIG. 8G, an oxide layer is deposited on the whole surface of the substrate and then an etching back process is carried out to form side wall oxide films 23 on side walls of the patterned mask oxide layer 22.

Figure 8H:
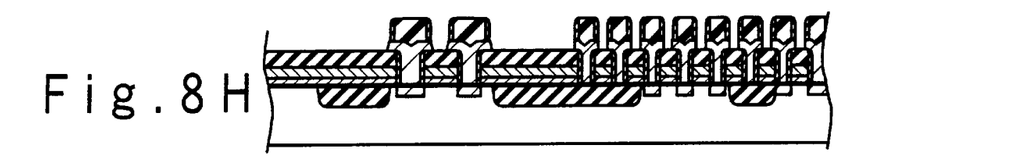

Next, as shown in FIG. 8H, the pad polysilicon layer 10 is patterned using the oxide films 22 and 23 as a mask. In this embodiment, the oxide film 22 with the side wall oxide films 23 is used. However, only the oxide film may be used.

Figure 8I:
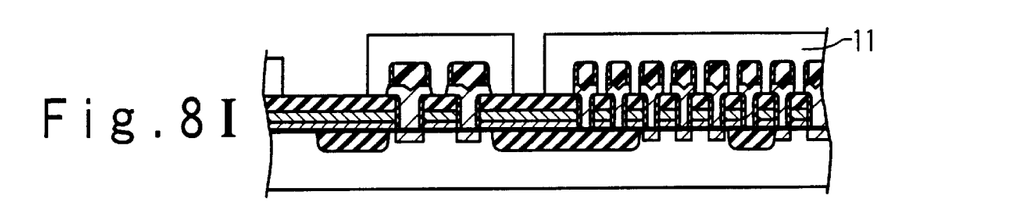
Figure 11:
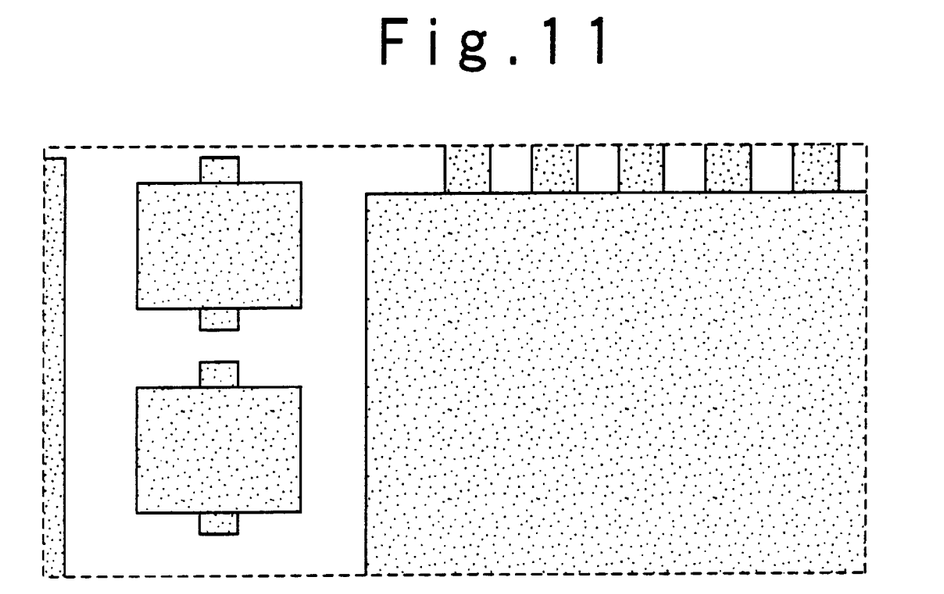
FIG. 11 is a plan view of a mask used in the in a manufacturing method according to a first embodiment of the present invention.

Thereafter, as shown in FIG. 8I, a part of the first gate patterns which have been formed as shown in FIG. 8C, is patterned based on the resist pattern 11 which is formed by use of the second gate pattern mask. FIG. 11 shows a plan view of the second gate pattern mask. The region where a lot of points are illustrated in the figure indicates the region where the resist pattern 11 is to be formed. The part of the first gate patterns to be patterned is the gate electrodes which have no pad polysilicon films.

Figure 8J:
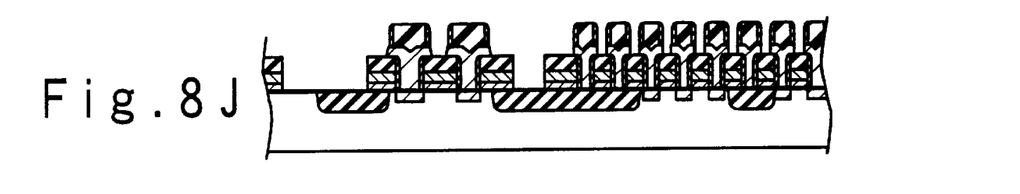

Next, as shown in FIG. 8J, the mask oxide film 6, the gate upper electrode 5, the gate lower electrode 4 are etched in order using the resist film 11 as a mask. Thus, the gate electrodes and the pad polysilicon films can be formed.

Figure 12:
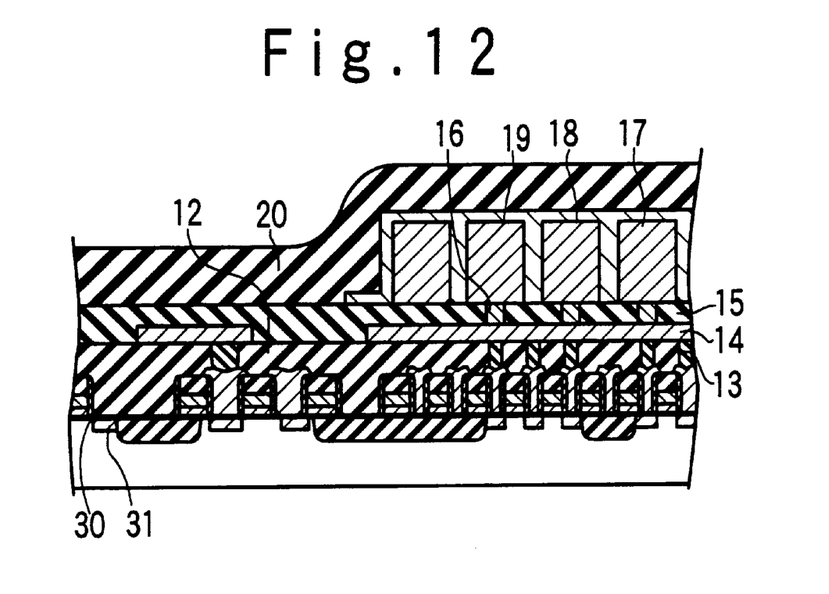
FIG. 12 is a cross sectional view of the semiconductor memory device produced in a manufacturing method according to a second embodiment of the present invention.

FIG. 12 shows a cross section of memory cells of the semiconductor memory device. In addition to the structure shown in FIG. 8J, an LDD structure 30 and an N-type diffusion layer 31 are formed for a transistor in the peripheral circuit. A first interlayer insulating film 12 is formed on the pad polysilicon films, and bit contacts 13 and a bit line 14 are formed. After a second interlayer insulating film 15 is formed, capacity contacts 16 and capacity lower electrodes 17 are formed. Capacity dielectric films 18 and capacity upper electrodes 19 are formed on the capacity lower electrode and then a third interlayer insulating film 20 is formed.

In this way, in the manufacturing the semiconductor device, there is no residual portion when the pad polysilicon films are etched. Also, the margin of the pad polysilicon film and the contact and the margin of the pad polysilicon film and the diffusion layer can be increased.

As described above, according to the semiconductor device manufacturing method of the present invention, the gate photoresist process is divided into two processes. Therefore, there are many flat surface gate electrodes with small quantity of opening portions when the pad polysilicon layer is formed, and the photoresist process and the etching process become easy. Also, the gate interval between the gate electrodes where the pad polysilicon film is formed can be approximately adjusted based on the interval between the cells. Thus, the film thickness of the pad polysilicon film can be determined based on only the film thickness on the film formation.

What is claimed is:

1. A method of manufacturing a semiconductor device, comprising:
    forming a laminate film above a semiconductor substrate, said laminate film including a conductive layer and an insulating layer formed on said conductive layer;
    performing a first etching process to said laminate film using a first mask to form a first group of patterns for first gates and a second group of patterns;
    depositing a polysilicon layer for pad polysilicon films after said first etching process;
    patterning said polysilicon layer to form said pad polysilicon films, comprising steps of:
        depositing a mask insulating film on said polysilicon layer;
        patterning said mask insulating film;
        forming side wall insulating films on side walls of the patterned mask insulating film; and
        patterning said polysilicon layer using the patterned mask insulating film with the side wall insulating films as a mask to form said pad polysilicon films; and
    performing a second etching process to said patterns of said second group using a second mask to form a third group of patterns for second gates.

2. A method according to claim 1, wherein said depositing including depositing said polysilicon layer such that said polysilicon layer substantially fills a space between adjacent two of said patterns of said first and second groups.

3. A method according to claim 1, further comprising:
    forming side wall insulating films on side walls of each of said patterns of said first and second groups before said depositing.

4. A method according to claim 1, wherein said semiconductor device is a semiconductor memory device composed of a memory cell section and a peripheral circuit section, and said first gates are of transistors for said memory cell section, and said second gates are of transistors for said peripheral circuit section.

5. A method of manufacturing a semiconductor device, comprising:
    forming a laminate film on an insulating film which is formed on a semiconductor substrate, said laminate film including a conductive layer and an insulating layer formed on said conductive layer;
    performing a first etching process to said laminate film using a first mask group of patterns for first gates group of patterns;
    depositing a polysilicon layer for pad polysilicon films after said first etching process;
    forming an oxide mask on said polysilicon layer, comprising steps of:
        depositing a mask insulating film on said polysilicon layer;
        patterning said mask insulating film; and
        forming side wall insulating films on side walls of the patterned mask insulating film;
    patterning said polysilicon layer using said oxide mask as a mask to form said pad polysilicon films; and
    performing a second etching process to said patterns of said second group using a second mask to form a third group of patterns for second gates.

6. A method according to claim 5, wherein said depositing includes:
    depositing a polysilicon layer such that said polysilicon layer substantially fills a space between adjacent two of said patterns of said first and second groups.

7. A method according to claim 5, further comprising:
    forming side wall insulating films on side walls of each of said patterns of said first and second groups.

8. A method of manufacturing a semiconductor device, comprising:
    forming a laminate film on an insulating film which is formed on a semiconductor substrate, said laminate film including a conductive layer and an insulating layer formed on said conductive layer;
    performing a first etching process to said laminate film to form first patterns such that a space between adjacent two of said first patterns can be filled with a polysilicon layer to be deposited;
    depositing said polysilicon layer;
    patterning said polysilicon layer to form pad polysilicon films, comprising steps of:
        depositing a mask insulating film on said polysilicon layer;
        patterning said mask insulating forming side wall insulating film; and
        forming side wall insulating films on side walls of the patterned mask insulating film; and
    performing a second etching process to specific ones of said first patterns to form second patterns.

9. A method according to claim 8, wherein said semiconductor device is a semiconductor memory device composed of a memory cell section and a peripheral circuit section, and said first gates are of transistors for said memory cell section, and said second gates are of transistors for said peripheral circuit section.

10. A method according to claim 8, further comprising:
    forming side wall insulating films on side walls of each of said first patterns.

* * * * *